United States Patent
Breeden et al.

(10) Patent No.: US 6,362,098 B1
(45) Date of Patent: Mar. 26, 2002

(54) PLASMA-ENHANCED CHEMICAL VAPOR DEPOSITION (CVD) METHOD TO FILL A TRENCH IN A SEMICONDUCTOR SUBSTRATE

(75) Inventors: Terry Alan Breeden, Cedar Creek; Iraj Eric Shahvandi, Round Rock; Michael Thomas Tucker, McKinney; Olivier Gerard Marc Vatel, Round Rock; Karl Emerson Mautz, Austin, all of TX (US); Ralf Zedlitz, Dresden (DE)

(73) Assignees: Motorola, Inc., Schaumburg, IL (US); Semiconductor 300 GmbH & Co. KG, Dresden; Infineon Technologies AG, Munich, both of (DE)

( * ) Notice: Subject to any disclaimer, the term of this patent is extended or adjusted under 35 U.S.C. 154(b) by 0 days.

(21) Appl. No.: 09/794,999
(22) Filed: Feb. 28, 2001
(51) Int. Cl.[7] .................................................. H01L 21/44
(52) U.S. Cl. ...................................... 438/680; 438/637
(58) Field of Search ................................. 438/424, 680, 438/710, 718, 724, 735, 744, 758, 783, 905, 438, 637, 660, 688

(56) References Cited

U.S. PATENT DOCUMENTS

| 5,182,221 A | 1/1993 | Sato | 437/67 |
|---|---|---|---|
| 5,824,562 A | * 10/1998 | Park | 438/637 |
| 6,009,827 A | 1/2000 | Robles et al. | 118/723 R |
| 6,051,114 A | * 4/2000 | Yao et al. | 204/192.3 |
| 6,136,211 A | * 10/2000 | Qian et al. | 216/37 |
| 6,270,862 B1 | * 8/2001 | McMillin et al. | 427/569 |

FOREIGN PATENT DOCUMENTS

| EP | 0856884 | 8/1998 | H01L/21/768 |
|---|---|---|---|
| EP | 0936665 | 8/1999 | H01L/21/762 |
| WO | WO 99/62108 | 12/1999 | H01L/21/02 |
| WO | WO 00/03425 | 1/2000 | H01L/21/318 |

* cited by examiner

Primary Examiner—David Nelms
Assistant Examiner—Phuc T. Dang
(74) Attorney, Agent, or Firm—Robert L. King

(57) ABSTRACT

In a CVD chamber (120) having a chuck (122) to hold a semiconductor substrate (100) and having a plasma generator (121) to generate a plasma (125), a trench in the substrate is filled with dielectric material from ions (126) of the plasma. The ions are forced to move in a direction (127) that is substantially perpendicular to the surface of the substrate by a pulsed unidirectional voltage between the plasma generator and the substrate, by a circular magnetic field, or by a combination of both fields.

12 Claims, 3 Drawing Sheets

PLASMA-ENHANCED CHEMICAL VAPOR DEPOSITION (CVD) METHOD TO FILL A TRENCH IN A SEMICONDUCTOR SUBSTRATE

FIELD OF THE INVENTION

The present invention generally relates to semiconductor manufacturing, and, more particularly, to chemical vapor deposition (CVD).

BACKGROUND OF THE INVENTION

Electronic circuits are manufactured from semiconductor substrates ("wafers") that are processed in a variety of steps such as, for example, lithography, etching, CVD, chemical-mechanical polishing (CMP). In some processing steps, dielectric material is deposited into trenches at the substrate surface. There is a continuous desire to perform the deposition uniform and free of so-called voids. The present invention seeks to provide an improved deposition method.

DETAILED DESCRIPTION OF A PREFERRED EMBODIMENT

Before explaining details of the present invention, the deposition of materials is shortly introduced.

Figure 1:
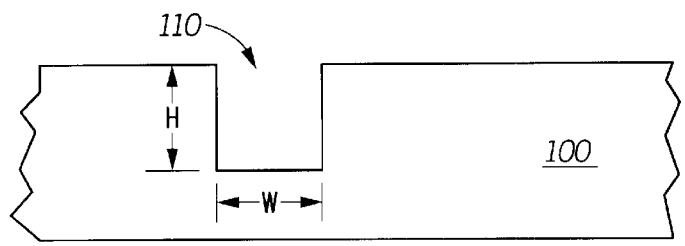
FIG. 1 illustrates a simplified cross-section diagram of a substrate with a trench.

FIG. 1 illustrates a simplified cross-section diagram of substrate 100 with trench 110. By CVD processing, trench 110 will be filled with a dielectric material, such as TEOS (tetra-ethoxysilane), shown in further figures. The dielectric material can be deposited by plasma-enhanced CVD that is often high-density CVD.

Trench 110 has a width W and a height (or "depth") H; the ratio H:W is referred to as aspect ratio. Typical ratios are, for example, in the range between 5:1 and 20:1. The deeper and narrower trench 110 is designed (the higher the aspect ratio), trench 110 becomes more and more susceptible to so-called voids, regions where dielectric material is not deposited.

Figure 2:
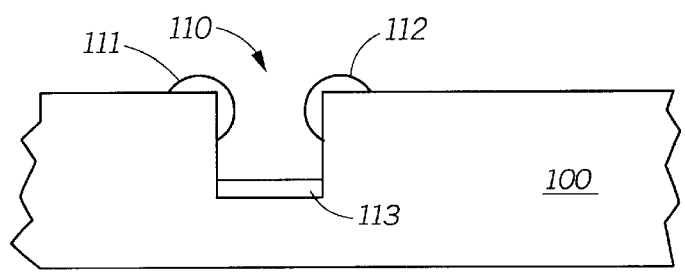
FIG. 2 illustrates a simplified cross-section diagram of the trench where dielectric material is deposited on the top edges (undesired) and from the bottom (desired)
Figure 3:
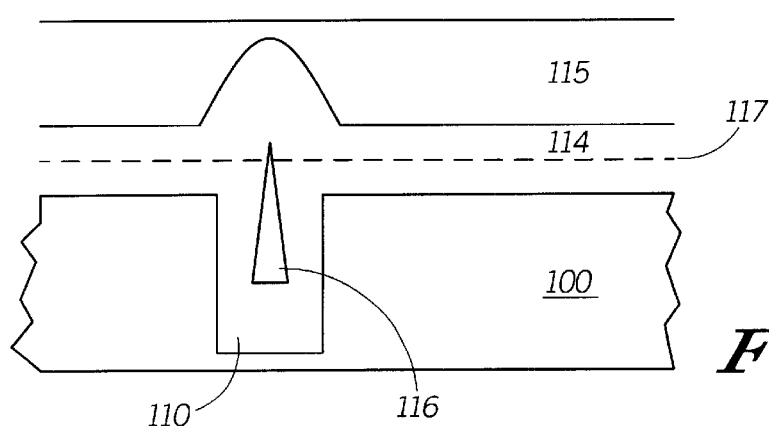
FIG. 3 illustrates a simplified cross-section diagram of the substrate with the trench, the voids and material layers.

FIG. 2 illustrates a simplified cross-section diagram of substrate 100 with trench 110 where dielectric material is deposited on top edges 111, 112 (undesired, so-called "overhanging") and deposited from bottom 113 (desired). FIG. 3 illustrates a simplified cross-section diagram of substrate 100 with trench 110, void 116, as well as material layers 114 and 115. Trench 110 is covered and filled with first layer 114 (dielectric, e.g., ILD or IMD) and second layer 115 (e.g., oxide cap).

Void 116 in trench 110 can accidentally open during further process steps, such as CMP to a predetermined plane (illustrated by dashed line 117). Void 116 can lead to leakage current between conductive metal connections that are deposited to substrate 100 later. Hence, void 116 contributes to degradation of the circuit reliability and performance.

The present invention is now explained in detail.

Figure 4:
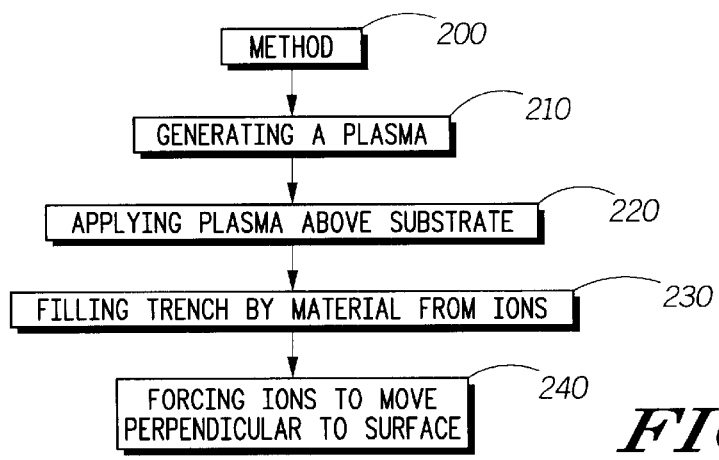
FIG. 4 illustrates a simplified flow chart diagram of a method according to the present invention.

FIG. 4 is a simplified flow chart diagram of CVD method 200 of the present invention to fill trench 110 at the surface of semiconductor substrate 100. The steps are generating 210 a plasma (cf. 125 in FIG. 5), applying 220 the plasma above substrate 100, and filling 230 trench 110 by dielectric material that originates from ions (cf. 126 in FIG. 5) in the plasma. Method 200 is characterized by the further step of forcing 240 the ions to move towards substrate 100 in a direction (cf. 127) that is substantially perpendicular to the surface of substrate 100. Preferably, forcing 240 is simultaneously with applying 220 and filling 230.

In other words, an ion beam to substrate 100 becomes directional; ions move straight to the bottom of trench 110 so that material deposition starts from there.

In a first embodiment of the invention, the ions are forced by an electrical field; in a second embodiment, the ions are forced by a magnetic field; in a third embodiment, electrical and magnetic fields are combined.

Describing details of the first and second embodiments independently is convenient for explanation, persons of skill in the art can combine both embodiments to the third embodiment without departing from the scope of the present invention.

Figure 5:
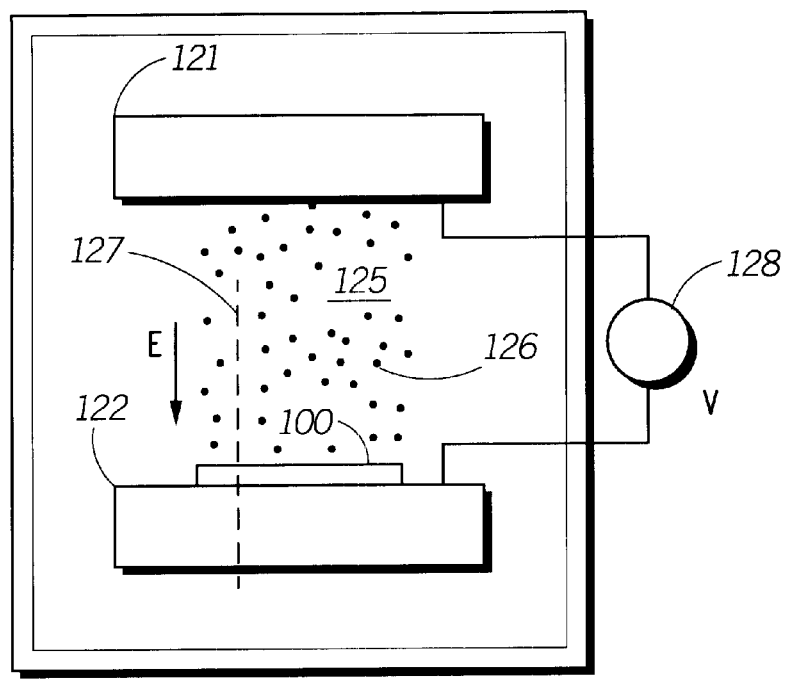
FIG. 5 illustrates a simplified diagram of a plasma CVD chamber that uses a first embodiment of the method of the present invention.

FIG. 5 illustrates a simplified diagram of plasma CVD chamber 120 that uses the first embodiment of the method of the present invention. CVD chamber 120 has chuck 122 to hold semiconductor substrate 100 (having trench 110, cf. FIG. 1); chamber 120 also has plasma generator 121 to generate plasma 125 to fill trench 110 by dielectric material from ions 126. Chamber 120 is characterized by means 128 to force the movement of ions 126 in direction 127 that is substantially perpendicular to the surface of substrate 100. In the first embodiment of FIG. 5, means 128 is implemented by a voltage source that is electrically coupled between plasma generator 121 and chuck 122 to apply a unidirectional pulsed voltage ("V") between generator 121 and chuck 122. The electrical field has a vector ("E") into direction 127 so that the ion beam is also directed. The electrical field dictates the way that the plasma beam goes before filling trench 110.

The polarity of the voltage is selected such that that resulting electrical field between plasma generator 121 and substrate 100 causes substrate 100 to attract ions 126. In case of ions with positive charge (cations), substrate 100 has to be more negative than plasma generator 121 (i.e. substrate 100 at minus voltage); or vice versa, in case of ions with negative charge (anions), substrate 100 has to be more positive than plasma generator 121 (i.e., substrate 100 at plus voltage).

Figure 6:
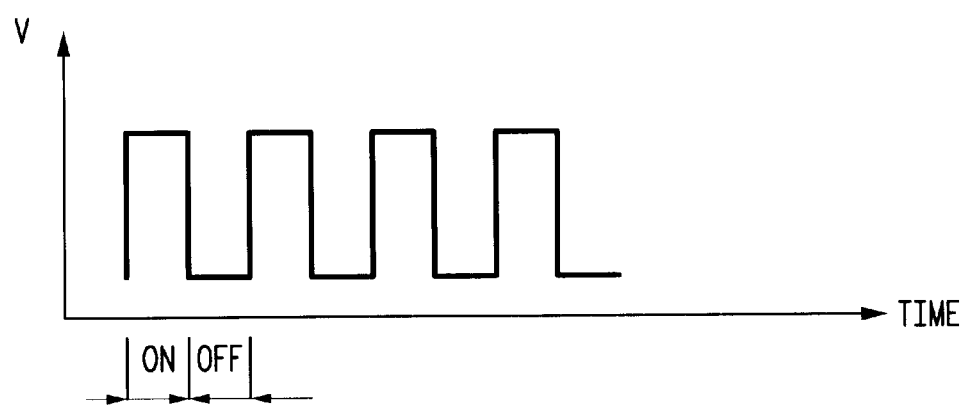
FIG. 6 illustrates a simplified duty cycle diagram for a voltage that is applied in the first embodiment.

FIG. 6 illustrates a simplified duty cycle diagram for the voltage V that is applied in the first embodiment. In repetitions of first and second intervals, voltage V is applied during the first interval ("ON") and is substantially not applied during the second interval ("OFF").

The duration of the ON interval corresponds to the time in which ions 126 travel from plasma generator 121 to substrate 100 in the mean free path. The mean free path is the average distance by which an ion travels before impacting another ion. The time that an ion remains in the mean free path is in the range between 1 microsecond to 1 millisecond.

The duration of the OFF interval corresponds to the time in which substrate 100 neutralizes, or in other words discharges. The time that substrate 100 needs to neutralize depends on the materials on substrate 100; person of skill in the art can measure this time. By substantially not applying voltage V in the OFF interval, the present invention allows the charge of substrate 100 to remain below a maximum allowable charge. The duty cycle can be symmetric, i.e. with substantially equal ON and OFF duration, or asymmetric with substantially different ON and OFF duration.

Figure 7:
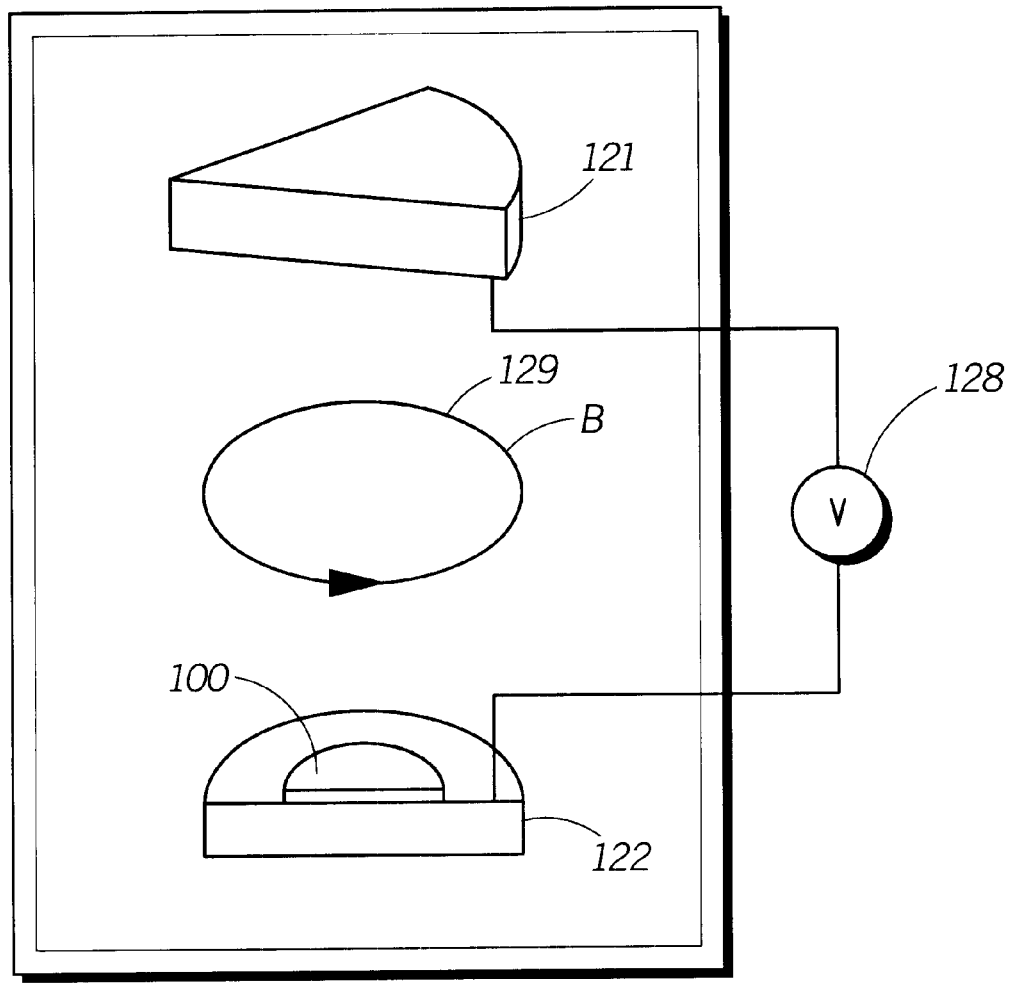
FIG. 7 illustrates a simplified diagram of a plasma CVD chamber that uses second and third embodiments of the method of the present invention.

FIG. 7 illustrates a simplified diagram of plasma CVD chamber 120 that uses the second embodiment of the method of the present invention. Similar as in FIG. 5, chamber 120 is illustrated with plasma generator 121, chuck 122 and substrate 100; for convenience, these elements are illustrated in their spatial extension. For simplicity, the plasma and the ions are not illustrated. Forcing 240 (cf. FIG. 4) the ions to move is performed by applying circular magnetic field 129 between plasma generator 121 and substrate 100. Preferably, the plane that is described by the magnetic field lines ("B") is parallel to the substrate surface.

Optionally, magnetic field 129 provides a containment that substantially prevents plasma from touching walls of chamber 120. Persons of skill in the art can provide magnetic field 129, for example, by magnets that are located inside or outside of chamber 120.

As mentioned above, electrical and magnetic fields can be combined by applying them substantially simultaneously. As further illustrated in FIG. 7, in the third embodiment, a pulsed voltage is applied between plasma generator 121 and substrate 100. This can be accomplished, for example, by voltage source 128 similar to that illustrated in FIG. 5. The combination of electrical and magnetic fields has the advantage that the magnetic field enhances plasma generation and provides containment and that the pulsed electrical field forces the ions to substrate 100.

While the invention has been described in terms of particular structures, devices and methods, those of skill in the art will understand based on the description herein that it is not limited merely to such examples and that the full scope of the invention is properly determined by the claims that follow.

We claim:

1. A chemical vapor deposition (CVD) method to fill a trench at a surface of a semiconductor substrate, with the steps of generating a plasma with a plasma generator, applying said plasma above the surface of said semiconductor substrate, and filling said trench by dielectric material that originates from ions in said plasma, said method further characterized by forcing said ions to move towards said substrate in a direction that is substantially perpendicular to the surface of said semiconductor substrate by coupling a first voltage terminal to the semiconductor substrate and coupling a second voltage terminal to the plasma generator and applying a voltage having only a single polarity, the voltage being applied during a first interval and substantially not applying the voltage during a second interval wherein the first interval and the second interval are repeated periodically, the trench being filled during both the first interval and the second interval.

2. The method of claim 1, wherein said step of forcing said ions to move is performed by applying a negative voltage between a plasma generator and said substrate during the first interval.

3. The method of claim 2, wherein said negative voltage is a voltage that forces the ions to move unidirectionally.

4. The method of claim 3, wherein, in repetitions of the first and second intervals, said voltage is applied during the first interval for a duration substantially in the range between one microsecond and one millisecond.

5. The method of claim 4, wherein the duration of the first interval corresponds to the time in which said ions travel from the plasma generator to said substrate in the mean free path.

6. The method of claim 4, wherein a duration of the second interval corresponds to the time in which said substrate neutralizes.

7. The method of claim 1, wherein said step of forcing said ions to move is performed by additionally applying a circular magnetic field between a plasma generator and said substrate.

8. The method of claim 7, wherein said magnetic field provides a containment that substantially prevents said plasma from touching chamber walls.

9. A CVD chamber with a chuck to hold a semiconductor substrate having a trench in an exposed surface opposite the chuck and with a plasma generator to generate a plasma to fill said trench by dielectric material from ions, said chamber characterized by a voltage source having a first terminal connected to the chuck and a second terminal connected to the plasma generator to force movement of said ions in a direction that is substantially perpendicular to the exposed surface of said semiconductor substrate by repetitively providing a varying voltage that alternates between a voltage having a predetermined single polarity and removal of the voltage so that the varying voltage continuously maintains a single polarity.

10. The CVD chamber of claim 9, wherein said voltage source maintains the voltage of predetermined single polarity during a portion of a cycle, the portion being in a range between one microsecond to one millisecond.

11. The CVD chamber of claim 9 further comprising a magnetic field having a vector that is substantially perpendicular to the exposed surface of said semiconductor substrate.

12. The CVD chamber of claim 9, wherein said voltage source generates an electric field having a vector that is substantially perpendicular to the exposed surface of said semiconductor substrate.

* * * * *